United States Patent
Park et al.

(10) Patent No.: US 9,382,118 B2
(45) Date of Patent: Jul. 5, 2016

(54) METHOD OF MANUFACTURING GRAPHENE

(71) Applicant: Hanwha Techwin Co., Ltd., Changwon-si (KR)

(72) Inventors: Chonghan Park, Changwon-si (KR); Seungmin Cho, Changwon-si (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 14/925,721

(22) Filed: Oct. 28, 2015

(65) Prior Publication Data

US 2016/0130150 A1    May 12, 2016

Related U.S. Application Data

(63) Continuation of application No. PCT/KR2015/001409, filed on Feb. 12, 2015.

(30) Foreign Application Priority Data

Nov. 11, 2014   (KR) .................. 10-2014-0156250

(51) Int. Cl.

| | | |
|---|---|---|
| *C01B 31/02* | (2006.01) | |
| *C01B 31/04* | (2006.01) | |
| *B82Y 40/00* | (2011.01) | |
| *H01L 21/02* | (2006.01) | |
| *H01L 29/16* | (2006.01) | |
| *C23C 16/01* | (2006.01) | |
| *C23C 16/26* | (2006.01) | |

(52) U.S. Cl.
CPC ............. *C01B 31/0446* (2013.01); *B82Y 40/00* (2013.01); *C01B 31/0453* (2013.01); *C01B 31/0484* (2013.01); *C23C 16/01* (2013.01); *C23C 16/26* (2013.01); *H01L 21/02527* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 2002/0098083 A1* | 7/2002 | Blangetti | ................. C23C 8/36 415/200 |
| 2014/0205763 A1 | 7/2014 | Lu et al. | |

FOREIGN PATENT DOCUMENTS

| | | |
|---|---|---|
| KR | 10-2011-0031864 A | 3/2011 |
| KR | 10-2012-0001354 A | 1/2012 |
| KR | 10-2012-0030780 A | 3/2012 |
| KR | 10-1122676 B1 | 3/2012 |
| WO | WO2012039533   * | 3/2012 ............. C01B 31/02 |

OTHER PUBLICATIONS

Search Report and Written Opinion dated Aug. 4, 2015 issued by the International Searching Authority in counterpart International Patent Application No. PCT/KR2015/001409 (PCT/ISA/210 and PCT/ISA/237).

* cited by examiner

*Primary Examiner* — Jiong-Ping Lu
(74) *Attorney, Agent, or Firm* — Sughrue Mion, PLLC

(57) ABSTRACT

A method of manufacturing graphene includes preparing a support member, disposing a carbon layer on the support member, disposing a catalyst layer on the carbon layer, forming graphene on the catalyst layer, attaching a carrier to the graphene and forming a graphene-forming structure, separating the support member from the graphene-forming structure, and removing the catalyst layer.

5 Claims, 2 Drawing Sheets

METHOD OF MANUFACTURING GRAPHENE

TECHNICAL FIELD

The inventive concept relates to a method of manufacturing graphene, and more particularly, to a method of manufacturing graphene that may reduce the amount of a catalyst used for forming the graphene.

BACKGROUND ART

Recently, an interest in a carbon material such as fullerenes, carbon nanotubes, graphene, and graphite including carbon has been increasing.

Particularly, research into carbon nanotubes and graphene is under active progress. Particularly, since graphene may be formed in a large area and is not only electrically, mechanically, and chemically stable but also has excellent conductivity, graphene is in the limelight as a fundamental material of an electronic circuit.

Recently, manufacturing technology of large-area graphene has remarkably developed, and the paper (nature07719) titled "Large-scale pattern growth of graphene films for stretchable transparent electrodes" published in the magazine Nature on Jan. 14, 2009 discloses a process of manufacturing graphene by using chemical vapor deposition (CVD).

DETAILED DESCRIPTION OF THE INVENTIVE CONCEPT

Technical Problem

The inventive concept provides a method of manufacturing graphene that may reduce the amount of a catalyst used for forming the graphene.

Technical Solution

According to an aspect of the inventive concept, there is provided a method of manufacturing graphene, the method including: preparing a support member; disposing a carbon layer on the support member; disposing a catalyst layer on the carbon layer; forming graphene on the catalyst layer; attaching a carrier to the graphene and forming a graphene-forming structure; separating the support member from the graphene-forming structure; and removing the catalyst layer.

Advantageous Effects

According to an aspect of the inventive concept, a method of manufacturing graphene may reduce the amount of a catalyst used during a graphene-forming process by stacking a carbon layer on a support member and disposing a catalyst layer on the carbon layer. By doing so, manufacturing costs and manufacturing time of graphene may be reduced.

BEST MODE

Figures 1, 2, 3:
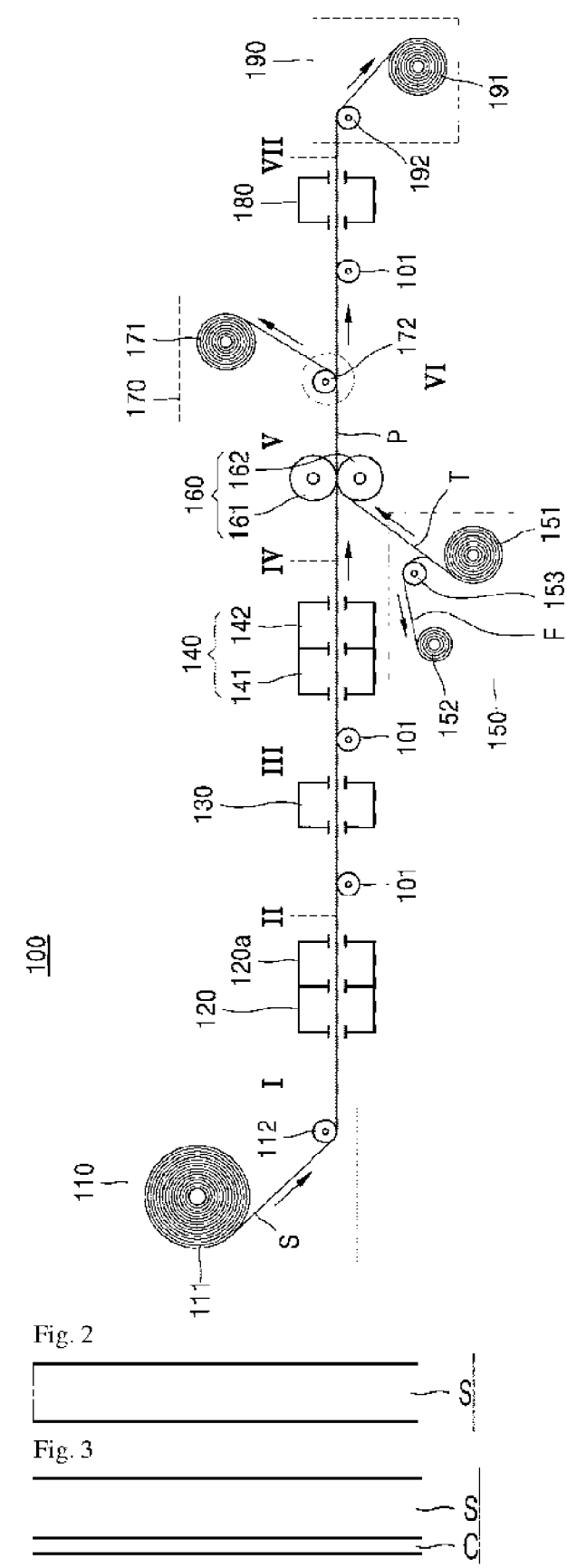
FIG. 1 is a schematic view illustrating a graphene-manufacturing apparatus that implements a method of manufacturing graphene according to an exemplary embodiment.
FIGS. 2 to 8 are schematic cross-sectional views sequentially illustrating a method of manufacturing graphene according to an exemplary embodiment.

According to an aspect of the inventive concept, there is provided a method of manufacturing graphene, the method including: preparing a support member; disposing a carbon layer on the support member; disposing a catalyst layer on the carbon layer; forming graphene on the catalyst layer; attaching a carrier to the graphene and forming a graphene-forming structure; separating the support member from the graphene-forming structure; and removing the catalyst layer.

Here, the support member may include a metallic material or a ceramic material.

Here, the carbon layer may have a property of hydrophobicity.

Here, the catalyst layer may include copper.

Here, during the separating of the support member from the graphene-forming structure, the carbon layer may be destroyed.

Here, the removing of the catalyst layer may be performed by an etching process.

Mode of the Inventive Concept

Hereinafter, exemplary embodiments are described in detail with reference to the accompanying drawings. Also, in the present specification and the drawings, like reference numerals are used for components having the substantially same construction, so that repeated descriptions are omitted. Also, for understanding, some of thicknesses, sizes, etc. have been exaggerated in the drawings.

FIG. 1 is a schematic view illustrating a graphene-manufacturing apparatus that implements a method of manufacturing graphene according to an exemplary embodiment.

The graphene-manufacturing apparatus 100 illustrated in FIG. 1 includes a support member supplier 110, a carbon layer-forming unit 120, a catalyst layer-forming unit 130, a graphene-forming unit 140, a carrier supplier 150, a stacking device 160, a support member collector 170, a catalyst layer remover 180, and a carrier collector 190.

The support member supplier 110 is a unit supplying a support member S. The support member supplier 110 includes a foil supply roll 111 and a foil guide roller 112.

The foil-shaped support member S is wound on the foil supply roll 111, and the support member S has a structure of nickel foil coated with chrome.

Though the support member S according to an exemplary embodiment has the structure of the nickel foil coated with chrome, exemplary embodiments of the inventive concept are not limited thereto. That is, the structure, shape, and material of the support member according to an exemplary embodiment are not specially limited. For example, the support member S may have a plate shape, and the support member S may include various materials such as tungsten, nickel, copper, ceramic, etc. However, the material of the support member S may be a material having a melting point of 900° C. or more if possible. This is because the support member S passes through the graphene-forming unit 140 of high temperature during a graphene-forming process.

Meanwhile, the carbon layer-forming unit 120 is a unit disposing a carbon layer C on the support member S.

The carbon layer-forming unit 120 forms the carbon layer C on the surface of the support member S by using sputtering, evaporation, a plasma method, etc.

A surface-treating unit 120a that performs surface treatment on the formed carbon layer C to make the carbon layer C hydrophobic is installed in the rear portion of the carbon layer-forming unit 120. The surface-treating unit 120a makes the carbon layer C hydrophobic by using a known surface-treating method. The hydrophobicity of the carbon layer C allows a catalyst layer H to be easily separated during a process of separating the catalyst layer H afterward.

Though the surface-treating unit 120a is installed in the rear portion of the carbon layer-forming unit 120 according to an exemplary embodiment, exemplary embodiments of the inventive concept are not limited thereto. That is, the surface-treating unit 120a may not be installed in the rear portion of the carbon layer-forming unit 120 according to an exemplary embodiment.

Meanwhile, the catalyst layer-forming unit 130 is a unit forming a catalyst layer H on the carbon layer C formed on the support member S and disposing the catalyst layer H on the carbon layer C formed on the support member S. The catalyst layer H includes a copper material, and the catalyst layer-forming unit 130 forms the catalyst layer H on the surface of the carbon layer C by using sputtering, evaporation, etc.

Though the catalyst layer H according to an exemplary embodiment includes a copper material, the kind of the material of the catalyst layer H according to an exemplary embodiment is not specially limited. For example, any material may be used as far as the material of the catalyst layer H according to an exemplary embodiment may absorb carbon and grow graphene while chemical vapor deposition is performed, and there is no special limitation in selecting the material. That is, for the material of the catalyst layer H according to an exemplary embodiment, various materials such as Ni, Al, Fe, Co, and W may be used.

The graphene-forming unit 140 is a unit forming graphene G on the surface of the catalyst layer H of the support member S, and includes a reactor 141 and a cooler 142.

The reactor 141 is a reactor for thermal chemical vapor deposition and inductive coupled plasma chemical vapor deposition (ICP-CVD). After a gas including carbon such as $CH_4$, $C_2H_2$, $C_2H_4$, CO, etc. is injected into the reactor 141, the reactor 141 operates a heater installed therein and maintain the inside of the reactor 141 at about 300-2000° C. to allow carbon to be absorbed on the catalyst layer H passing through a space inside the reactor 141.

The catalyst layer H that has passed through the reactor 141 moves to the cooler 142. The catalyst layer H is cooled down at a cooling speed of about 30-600° C. per minute (30-600° C./min) in the cooler 142, so that graphene G grows and is formed on the surface of the catalyst layer H.

Meanwhile, the carrier supplier 150 is a unit supplying a carrier T that attaches to graphene G.

The carrier supplier 150 includes a carrier supply roll 151, a cover film-collecting roll 152, and a cover film guide roller 153.

A carrier T is wound on the carrier supply roll 151, and has a film tape shape. An adhesive material is disposed on one side of the carrier T, and a cover film F is attached on the adhesive material.

The cover film-collecting roll 152 is a unit separating the cover film F from the carrier T and collecting the cover film F. The cover film F separated from the carrier T is guided by the cover film guide roller 153, and then wound on the cover film-collecting roll 152.

Though the carrier T according to an exemplary embodiment has a film tape, exemplary embodiments of the inventive concept are not limited thereto. That is, the shape of the carrier according to an exemplary embodiment is not specially limited, and the material, shape, etc. of the carrier according to an exemplary embodiment are not specially limited as far as the carrier is attached to graphene G. For example, a liquid material may be used as the carrier T, and in this case, the liquid material is coated on graphene G and then hardened to have a solid film shape.

Meanwhile, the stacking device 160 is a device forming a graphene-forming structure P by compressing the carrier T on graphene G and attaching the carrier T to the graphene G. For this purpose, the stacking device 160 includes a pair of stacking rollers 161 and 162 that face each other.

Though the stacking device 160 according to an exemplary embodiment includes the pair of stacking rollers 161 and 162 that face each other, exemplary embodiments of the inventive concept are not limited thereto. That is, the stacking device 160 according to an exemplary embodiment only has to perform a function of attaching the carrier T to the graphene G, and a specific construction thereof is not specially limited. For example, the stacking device 160 according to an exemplary embodiment may include a pair of plate-shaped pressurizing plates that face each other. In this case, the pressurizing plates may attach the carrier T to the graphene G by pushing and compressing one side of the support member S and one side of the carrier T.

The support member collector 170 is a unit separating the support member S from the graphene-forming structure P, and includes a support member-collecting roll 171 and a support member guide roller 172.

A separated foil-shaped support member S is wound on the support member-collecting roll 171, and one side of the support member S is guided by the support member guide roller 172.

Though the support member collector 170 according to an exemplary embodiment includes the support member-collecting roll 171 and the support member guide roller 172, exemplary embodiments of the inventive concept are not limited thereto. That is, the support member collector 170 according to an exemplary embodiment may have a different construction. For example, in the case where the support member S has a plate shape, not a foil shape, the support member collector 170 may have a construction of sucking one side of the support member S and then pulling the same to separate the support member S from the graphene-forming structure P.

Meanwhile, the catalyst layer remover 180 is a unit removing the catalyst layer H. That is, the catalyst layer H located on one side of the graphene G is removed by the catalyst layer remover 180, and the carbon layer C remaining on the catalyst layer H is removed together with the catalyst layer H during this process.

An etching solution is supplied to the catalyst layer remover 180 and an etching process is performed. As an applied etching solution, acid, HF, buffered oxide etch (BOE), solution $FeCl_3$, solution $Fe(NO_3)_3$, etc. may be used.

Though the catalyst layer remover 180 has a construction of using a wet etching process that uses an etching solution, exemplary embodiments of the inventive concept are not limited thereto. For example, an etching process that removes the catalyst layer at the catalyst layer remover according to an exemplary embodiment may be a known dry etching process, and a process that uses sputtering may be used.

The carrier collector 190 is a unit performing a process of collecting the carrier T to which graphene G is attached. For this purpose, the carrier collector 190 includes a carrier-collecting roll 191 and a carrier guide roller 192.

The carrier-collecting roll 191 is a unit collecting a carrier T to which graphene G is attached. The carrier T is guided by the carrier guide roller 192 and then wound on the carrier-collecting roll 191.

Meanwhile, besides the above-described constructions, the graphene-manufacturing apparatus 100 may have various constructions. The graphene-manufacturing apparatus 100 may include a plurality of transfer rollers 101, and may include a vacuum chamber and a vacuum unit for allowing an entire process or some processes to be performed under a vacuum state.

Hereinafter, processes of manufacturing graphene by using the graphene-manufacturing apparatus 100 according to an exemplary embodiment are described with reference to FIGS. 1 to 8. FIGS. 2 to 8 are schematic cross-sectional views sequentially illustrating a method of manufacturing graphene according to an exemplary embodiment.

First, an operator supplies the foil supply roll 111 on which a support member S is wound to the support member supplier 110 and installs the foil supply roll 111 (a support member-preparing operation: operation 101).

The support member supplier 110 unwinds the support member S wound on the foil supply roll 111 by using rotation of the foil supply roll 111, and the unwound support member S is guided by the foil guide roller 112 and transferred to the carbon layer-forming unit 120. FIG. 2 illustrates the cross-section of the support member S at a point I of FIG. 1.

The carbon layer-forming unit 120 disposes a carbon layer C on one side of the support member S transferred to the carbon layer-forming unit 120 (a carbon layer-disposing operation: operation 102).

The carbon layer-forming unit 120 forms the carbon layer C on the surface of the support member S by using sputtering, evaporation, a plasma method, etc., and the thickness of the formed carbon layer C is 10 μm or less. Subsequently, the support member S on which the carbon layer C has been formed is transferred to the surface-treating unit 120a, which makes the carbon layer C hydrophobic by surface-treating the carbon layer C, and then the support member S is transferred to the catalyst layer-forming unit 130. FIG. 3 illustrates the cross-sections of the support member S and the carbon layer C at a point II of FIG. 1.

The catalyst layer-forming unit 130 disposes a catalyst layer H on the carbon layer C of the support member S transferred to the catalyst layer-forming unit 130 (a catalyst layer-disposing operation: operation 103).

Figure 4:
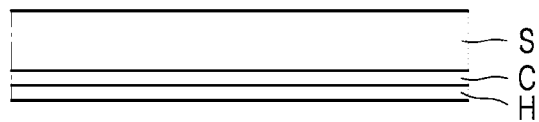

The catalyst layer-forming unit 130 forms and disposes the catalyst layer H on the carbon layer C. The catalyst layer-forming unit 130 forms the catalyst layer H by disposing Cu on the surface of the carbon layer C to about 0.05-5 μm by using sputtering, evaporation, etc. FIG. 4 illustrates the cross-sections of the support member S, the carbon layer C, and the catalyst layer H at a point III of FIG. 1. Subsequently, the support member S including the catalyst layer H is transferred to the graphene-forming unit 140.

The graphene-forming unit 140 forms graphene G on the catalyst layer H of the support member S transferred to the graphene-forming unit 140 (a graphene-forming operation: operation 104).

Figure 5:
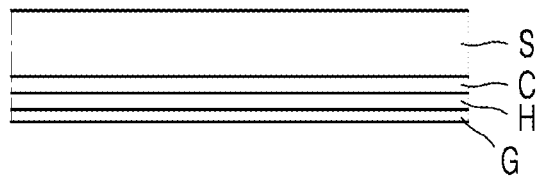

That is, the support member S transferred to the graphene-forming unit 140 is transferred to the reactor 141. Gases including carbon ($CH_4$, $C_2H_2$, $C_2H_4$, CO, etc.) are injected to the reactor 141 and heated, and the temperature of the inside of the reactor 141 is maintained at about 300-2000° C. to allow carbon to be absorbed on the catalyst layer H passing through a space inside the reactor 141. Subsequently, the support member S moves to the cooler 142. The catalyst layer H is cooled down at a cooling speed of about 30-600° C. per minute (30-600° C./min) in the cooler 142, so that graphene G grows and is formed on the surface of the catalyst layer H. FIG. 5 illustrates the cross-sections of the support member S, the carbon layer C, the catalyst layer H, and the graphene G at a point IV of FIG. 1. Subsequently, the support member S including the graphene G is transferred to the stacking device 160.

The stacking device 160 attaches a carrier T to the graphene G of the support member S transferred to the stacking device 160 and forms a graphene-forming structure P (an operation of attaching a carrier to graphene: operation 105).

Figure 6:
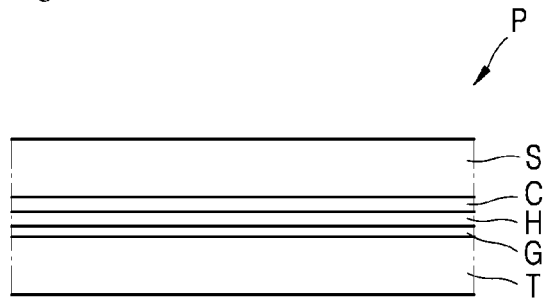

For this process, the carrier T is unwound from the carrier supply roll 151, and then a cover film F peels off and is transferred to the stacking device 160 where the carrier T contacts the graphene G. The pair of stacking rollers 161 and 162 of the stacking device 160 rotate to compress the carrier T and the graphene G against each other, so that the graphene-forming structure P is formed. FIG. 6 illustrates the cross-section of the graphene-forming structure P at a point V of FIG. 1. Subsequently, the graphene-forming structure P is transferred to the support member collector 170.

Meanwhile, the support member collector 170 separates and collects the support member S from the graphene-forming structure P transferred to the support member collector 170 (a support member-collecting operation: operation 106).

That is, the support member collector 170 separates and collects the support member S from the graphene-forming structure P, and one side of the support member S is guided by the support member guide roller 172, and the separated support member S is transferred to and wound on the support member-collecting roll 171.

Figure 7:
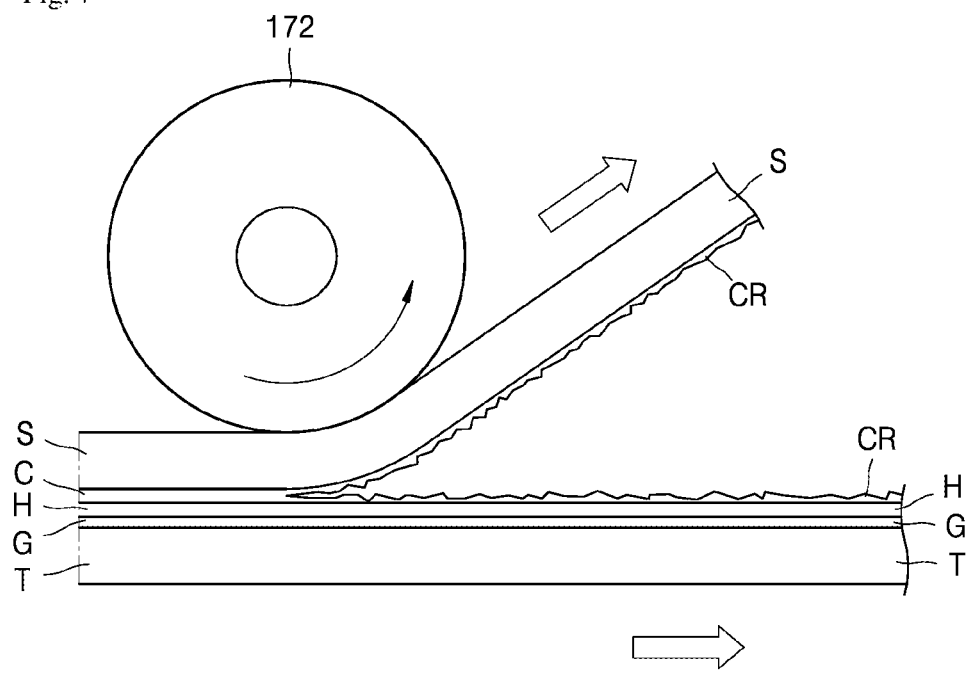

FIG. 7 illustrates that the support member S is separated from the graphene-forming structure P at a point VI of FIG. 1. At this point, the carbon layer C among portions of the graphene-forming structure P is destroyed during a process of separating the support member S. This is because the carbon layer C among the portions of the graphene-forming structure P is the weakest.

Since the support member S is separated from the graphene-forming structure P that has passed through the support member collector 170, the carrier T, the graphene G, the catalyst layer H, and a residual material CR of the carbon layer C remaining on the surface of the catalyst layer H remain in the graphene-forming structure P. The graphene-forming structure P of this structure moves to the catalyst layer remover 180.

The catalyst layer remover 180 removes the catalyst layer H in the graphene-forming structure P transferred to the catalyst layer remover 180 (a catalyst layer-removing operation: operation 107). Since the catalyst layer H is removed in this operation, the residual material CR of the carbon layer C existing on the catalyst layer H is naturally removed together with the catalyst layer H.

Figure 8:
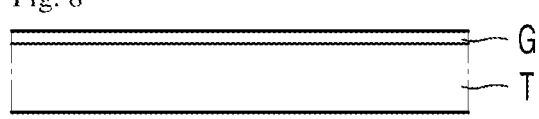

The catalyst layer remover 180 performs an etching process that uses an etching solution. As the etching solution, acid, HF, buffered oxide etch (BOE), solution $FeCl_3$, solution $Fe(NO_3)_3$, etc. may be used. FIG. 8 illustrates the structure (including the carrier T and the graphene G) of the graphene-forming structure P at a point VII of FIG. 1. That is, only the carrier T and the graphene G are left in the graphene-forming structure P that has passed through the catalyst layer remover 180, and the carrier T and the graphene G are transferred to the carrier collector 190.

The carrier collector 190 collects the graphene-forming structure P transferred to the carrier collector 190 by using the carrier-collecting roll 191 (a carrier-collecting operation: operation 108).

That is, in the carrier collector 190, the carrier T attached to the graphene G is guided by the carrier guide roller 192 and then wound on the carrier-collecting roll 191.

After that, a user may unwind the graphene-forming structure P wound on the carrier-collecting roll 191, transfer the graphene G attached to the carrier T and use the graphene G, or directly extract and use the graphene G.

As described above, according to an exemplary embodiment, the thickness of the catalyst layer H may be made thin by stacking the support member S, the carbon layer C, and the catalyst layer H, and forming graphene G on the stacked layer. That is, due to the existence of the support member S and the carbon layer C, the catalyst layer H may be made thin. By doing so, manufacturing costs may be reduced by reducing the amount of the catalyst used for the catalyst layer H. Also, since the amount of the catalyst used for the catalyst layer H is small, a process of removing the catalyst layer afterward may be swiftly performed, so that a manufacturing process and manufacturing time may be reduced. That is, since the amount of the catalyst required for synthesizing graphene may be reduced, manufacturing costs and manufacturing time of graphene may be reduced.

Also, according to the present exemplary embodiment, due to the existence of the carbon layer C disposed between the support member S and the catalyst layer H, combination by atom movements of the support member S and the catalyst layer H may be prevented during a graphene-forming process of high temperature performed by the graphene-forming unit 140, and the carbon layer C is easily destroyed compared with the other layers during the separation process of the support member S, so that the separation may be easily performed. Therefore, the total number of manufacturing processes may be reduced while high quality graphene may be manufactured due to the existence of the carbon layer C.

Also, according to the present exemplary embodiment, the support member S performs a function of a stiffener during the graphene-forming process of high temperature performed by the graphene-forming unit 140 to prevent crumpling, wrinkling, etc. of the catalyst layer H, so that high quality graphene may be manufactured.

Also, though the forming of graphene G has been described by using a roll-to-roll process according to the present exemplary embodiment, exemplary embodiments of the inventive concept are not limited thereto. That is, according to an exemplary embodiment, instead of the roll-to-roll process, a process of sequentially disposing the carbon layer C and the catalyst layer H on the plate-shaped support member S, forming graphene G during a graphene-forming process, and then transferring the graphene G to a carrier T may be used.

While the inventive concept has been described with reference to exemplary embodiments illustrated in the accompanying drawings, it will be understood by a person of ordinary skill in the art that various modifications and equivalents thereof in form and details may be made therein without departing from the spirit and scope of the following claims.

INDUSTRIAL APPLICABILITY

The inventive concept is applicable to a graphene-manufacturing method or a graphene-manufacturing apparatus.

The invention claimed is:

1. A method of manufacturing graphene, the method comprising:
    preparing a support member;
    disposing a carbon layer on the support member;
    disposing a catalyst layer on the carbon layer;
    forming graphene on the catalyst layer;
    attaching a carrier to the graphene and forming a graphene-forming structure;
    separating the support member from the graphene-forming structure;
    removing the catalyst layer; and
    wherein during the separating of the support member from the graphene-forming structure, the carbon layer is destroyed.

2. The method of claim 1, wherein the support member comprises a metallic material or a ceramic material.

3. The method of claim 1, wherein the carbon layer has a property of hydrophobicity.

4. The method of claim 1, wherein the catalyst layer comprises copper.

5. The method of claim 1, wherein the removing of the catalyst layer is performed by an etching process.

* * * * *